United States Patent [19]

Yamahata et al.

[11] Patent Number: 5,379,300

[45] Date of Patent: Jan. 3, 1995

[54] TEST SIGNAL OUTPUT CIRCUIT FOR LSI

[75] Inventors: Hitoshi Yamahata; Masahiro Kusuda, both of Tokyo, Japan

[73] Assignee: NEC Corporation, Tokyo, Japan

[21] Appl. No.: 858,614

[22] Filed: Mar. 27, 1992

[30] Foreign Application Priority Data

Mar. 27, 1991 [JP] Japan .................... 3-62292

[51] Int. Cl.$^6$ .................... G01R 31/28; H04B 17/00
[52] U.S. Cl. .................... 371/15.1; 371/22.1
[58] Field of Search ............ 371/22.1, 22.3, 15.1, 371/21.1, 22.6, 22.5

[56] References Cited

U.S. PATENT DOCUMENTS

| | | | |
|---|---|---|---|
| 4,710,927 | 12/1987 | Miller .................... | 371/22.1 |
| 4,811,299 | 3/1989 | Miyazawa et al. .................... | 371/21.1 |
| 5,001,713 | 3/1991 | Whetsel .................... | 371/22.3 |
| 5,040,150 | 8/1991 | Naiton et al. .................... | 371/21.1 |
| 5,072,447 | 12/1991 | Perloff et al. .................... | 371/15.1 |
| 5,109,190 | 4/1992 | Sakashita et al. .................... | 371/22.3 |
| 5,144,627 | 9/1992 | Horne et al. .................... | 371/22.1 |
| 5,257,267 | 10/1993 | Ishizaka .................... | 371/22.3 |

Primary Examiner—Charles E. Atkinson
Assistant Examiner—Joseph E. Palys
Attorney, Agent, or Firm—Sughrue, Mion, Zinn, Macpeak & Seas

[57] ABSTRACT

A test signal output circuit comprising a decoder for decoding test-mode signals from test-mode signal input terminals, and selectors each for, in response to the output of this decoder, selecting specified ones of internal signals of the LSI, and outputting them at the test signal output terminals.

In virtue of this, tests of the LSI in operation can be performed substantially without increasing the number of external connection terminals of LSI.

3 Claims, 7 Drawing Sheets

TEST SIGNAL OUTPUT CIRCUIT FOR LSI

BACKGROUND OF THE INVENTION

1. Field of the Invention

This invention relates to a test signal output circuit for LSI (large scale integrated circuits) .

2. Description of the Prior Art

In virtue of the remarkable progress in semiconductor technology, fine processing technology and system technology, LSIs of such high integration level that could not be supposed an age ago have been realized. An electronic circuitry having as many as 30,000 gates can be mounted in an so small ceramic package as 2.8 cm×2.8 cm×0.7 cm. Thus, for example, it has become possible to mount an arithmetic processor capable of performing trigonometrical function calculation, or 16 megabit memory on a single chip.

With acceleration of integration to higher level however the evaluation and tests of LSI become more difficult because it is not avoidable to limit the number of connection terminals whereas a larger number of circuits for complex arithmetic function is enclosed at a higher density. In other words, measurement of signals appearing at external connection terminals usable to user, and nothing else, the evaluation and tests of a number of circuits described above are impossible. The procedure of observing the signal waveforms of desired sites in an LSI by a probe can be used before packaging of the LSI. It however not only cannot be used originally for tests of a product having been claimed by a user but also is becoming difficult to accomplish even before package as the internal interconnection becomes finer structure with higher level integration of LSI. In these circumstances test signal output means is essential which permits to monitor at external terminals the signal waveforms at specified sites in the LSI.

A test signal output circuit of this type in the prior art is provided, in addition to ordinary external connection terminals with a plurality of test signal output terminals, as unusable to the user, which are connected to specified sites in the LSI where the signal waveforms are needed to be observed. This construction is disadvantageous in the respect that a plurality of terminals for exclusive use in tests are needed, in addition to ordinary external connection terminals to be provided on the surface of the LSI, which not only brings an effect of lowering the integration level of the LSI but also requires increase in the number of terminals with to the number of test signals.

There is another test signal output circuit of this type in the prior art which is constructed so that in response to a test mode signal supplied at the test mode signal input terminal, the LSI is switched from normal operation mode to test mode, whereby ordinary external connection terminals can be used for test signal outputs only for the test mode periods.

This technique however has disadvantage that not only ordinary signals cannot be outputted for test mode periods but also the time required for mode switching becomes longer in some cases of test-mode signal construction.

BRIEF SUMMARY OF THE INVENTION

Object of the Invention

It is an object of the present invention to provide a test signal output circuit permitting in test mode signals at specified sites in an LSI in operation to be issued to the external without exerting influence on normal output signals.

Another object of the present invention is to provide a test signal output circuit permitting in test mode signals at specified sites in a LSI in operation to be issued to the external via the minimized number of test signal output terminals without exerting influence on normal output signals.

Summary of the Invention

A test signal output circuit for LSI according to the present invention consists of at least one test signal output terminal, at least one test-mode signal input terminal, a decoder for decoding a test-mode signal from the test-mode signal input terminal, and at least one selector for passing, in response to the outputs of the decoder, selectively at least one specified internal signal in the LSI to the test signal output terminals.

In normal operation mode except when in test mode of applying the above-mentioned test mode signals, the test signal output terminals, test-mode signal input terminals, decoder and selectors mentioned above are in non-operation and normal input output signals are delivered via ordinary external connection terminals.

The construction permitting in test mode test signals are output not only via the test signal output terminals but also via some of ordinary external connection terminals is possible.

A preferred test signal output circuit for LSI according to the present invention consists of n (in number) test signal output terminals, m (in number) test-mode signal input terminals, a m-input $2^m$-output decoder for decoding test-mode signals from these test mode signal input terminals, and n (in number) selectors for passing selectively signals from $2^m$ sites in an LSI to the test signal output terminals in response of the outputs of the decoder. This circuit configuration permits to signaled, as outputs, selectively from $2^m \times n$ specified sites in an LSI.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
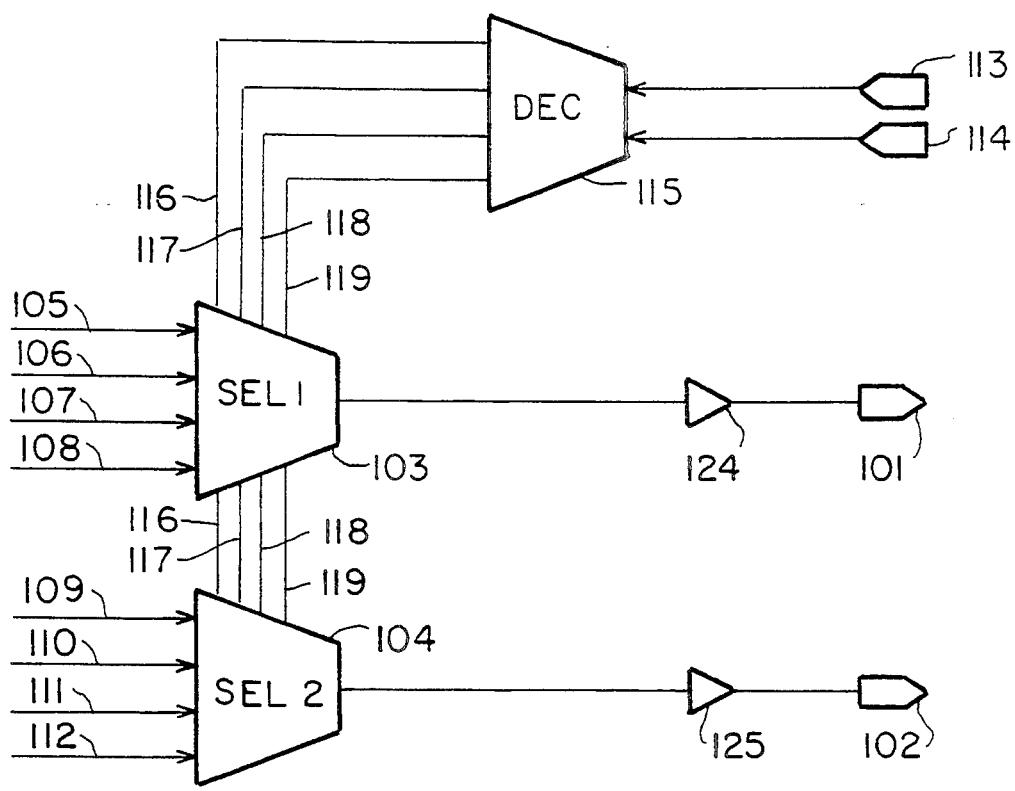
FIG. 1 is a circuit diagram of the first embodiment of the present invention.

In FIG. 1 is diagramed the test signal output circuit as the first embodiment of the present invention made the known technique on the surface of a LSI (not shown) by the well-known technique and its scale is very small-size compared with the main circuitry performing the essential function of the LSI.

This embodiment consists of two test signal output terminals 101, 102, two test-mode signal input terminals 113, 114, a decoder 115 for decoding the test-mode signals from these input terminals, and two selectors 103, 104 for passing internal signals from the later-described specified sites in the LSI in response to the outputs of the decoder through output gates 124, 125, respectively, to output terminals 101, 102.

Decoder 115 decodes 2-bit test-mode signals from test-mode signal input terminals 113, 114 and produces 4 decoder outputs 116 through 119. Each selector 103, 104 allows in response to decoder outputs 116 to 119 selectively one out of internal signals 105 to 108 or 109 to 112 inputting thereat to pass through output gates 124, 125, respectively, to test signal output terminals 101, 102, respectively, to output them from there. Test signal output terminals 101, 102 and test-mode input terminals 113, 114 as external connection terminals of the LSI are used exclusively for tests. The other connection terminals for the input and output of normal signals in and from the LSI are not shown.

Internal signals 115 to 112 are issued from specified sites in the LSI, such as some of micro code ROM, nanocode ROM and exception decoder in a floating-point arithmetic processor, which are PLAs to be tested. (for detail of this processor, refer to IEEE JOURNAL OF SOLID-STATE CIRCUITS, Vol.24 (No.5), October (1989), p.1326, FIG. 2.

The tests of LSI using this circuit is carried out by application of parallel 2-bit test-mode signals to test-mode signal input terminals 113, 114 when the LSI is in operation. In response to this 2-bit test-mode signals, decoder 115 makes one of decoder outputs 116 to 119 a 1.

Selector 103 passes one out of internal signals 105 to 108 corresponding to the decoder output set to a 1, through an output gate 124 to test signal output terminal 101.

Similarly selector 104 passes one internal signal corresponding to one out of decoder outputs 116 to 119 set to a 1, through an output gate 124 to test signal output terminal 101.

Similarly selector 104 outputs selectively the internal signal corresponding to one out of the decoder outputs 116 to 119 set to a 1 through an output gate 125 to test signal output terminal 102.

Figure 2:
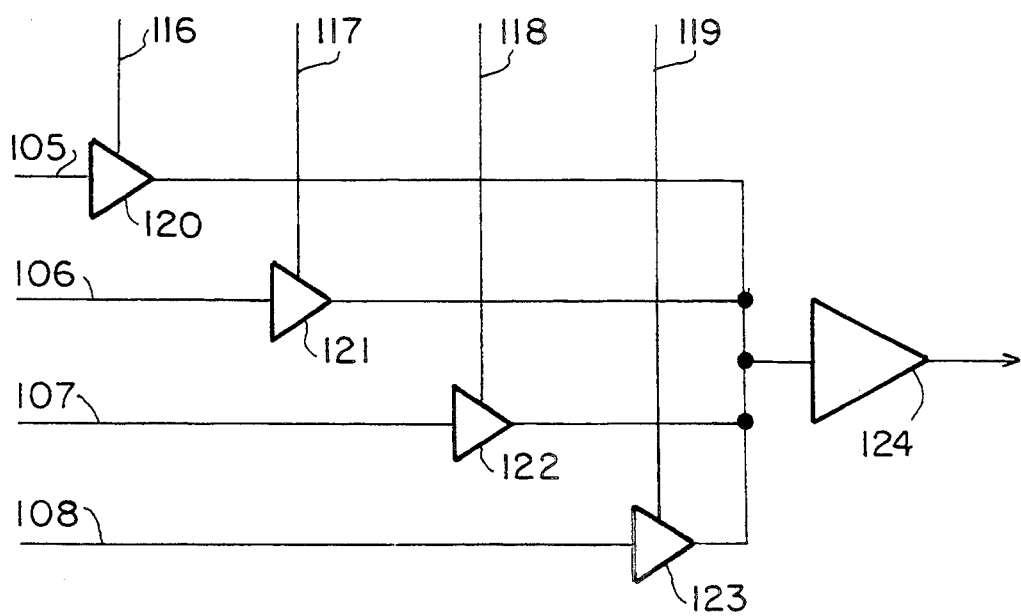
FIG. 2 is a detailed circuit diagram of a part of the first embodiment.

Selector 103, as diagramed in detail in FIG. 2, consists of four 3-state gate circuits 120 to 123 inter-connected in parallel, each receiving decoder outputs 116 to 119, respectively, at its control-signal input and connected to the above-mentioned specified sites of the LSI, respectively. The outputs of these gate circuits t0 are connected (ORed) together and gated by output gate 124. Selector 104 has similar configuration and hence is not shown.

Control inputs, or decoder outputs 116 to 119, each, when 0, turn OFF the corresponding 3-state gates 120 to 123 which thus do not allow respective internal signals 105 to 108 to pass them, and when 1, turn ON them thereby to allow that. Thus selector 103 outputs selectively one of internal signals 105 to 108.

The embodiment of FIG. 1 is additionally provided with two test-mode input terminals 113, 114, and two test signal output terminals, totally four terminals for tests, as described above, and thereby enables to monitor eight different internal test signals of the LSI in operation at the test signal output terminals. At the same time two internal test signals, one each test signal output terminal, can be monitored.

Figure 3:
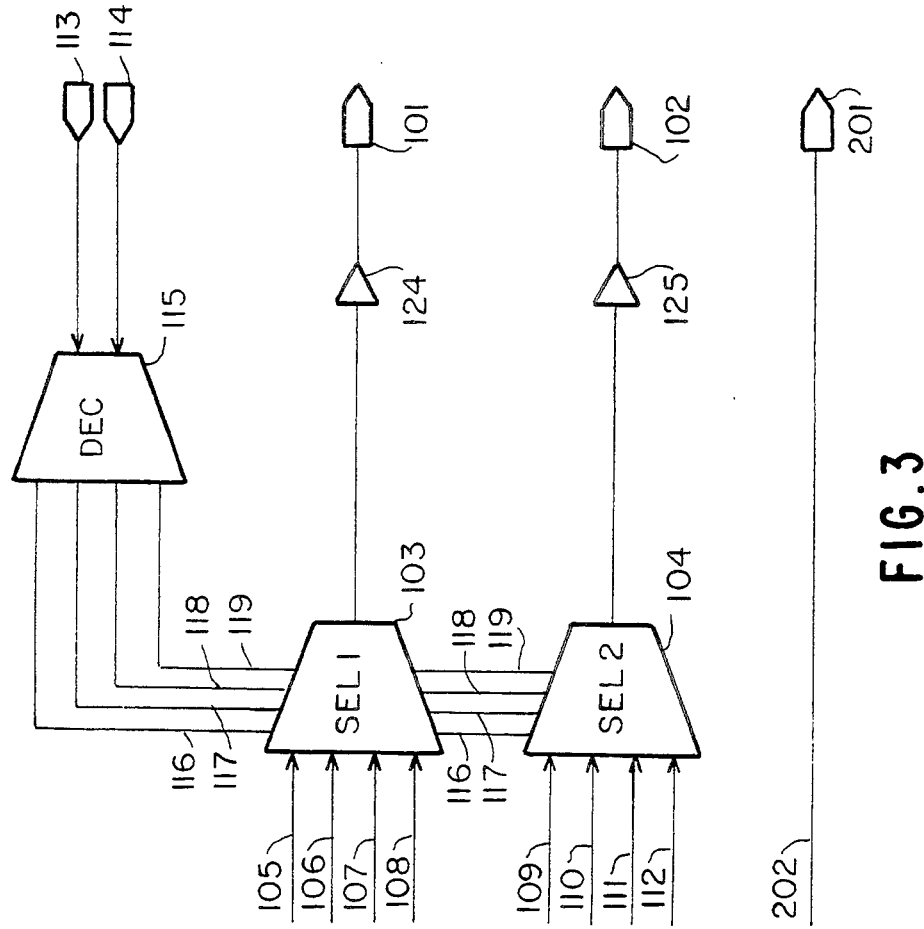
FIG. 3 is a circuit diagram of the second embodiment of the present invention.

In the second embodiment of the present invention diagramed in FIG. 3, the corresponding components and parts to those in the first embodiment are designated by the same reference numerals. As apparent from FIG. 3, it is different from the first embodiment in the respect of comprising an additional test signal output terminal 201 at which internal signal 202 is available. This construction is adapted to deliver internal signals having high bit rates directly at the test signal output terminal. Further increase of the number of such test signal output terminals allowing direct output is possible but accompanied by reduction in integration level of LSI as stated above.

Figure 4:
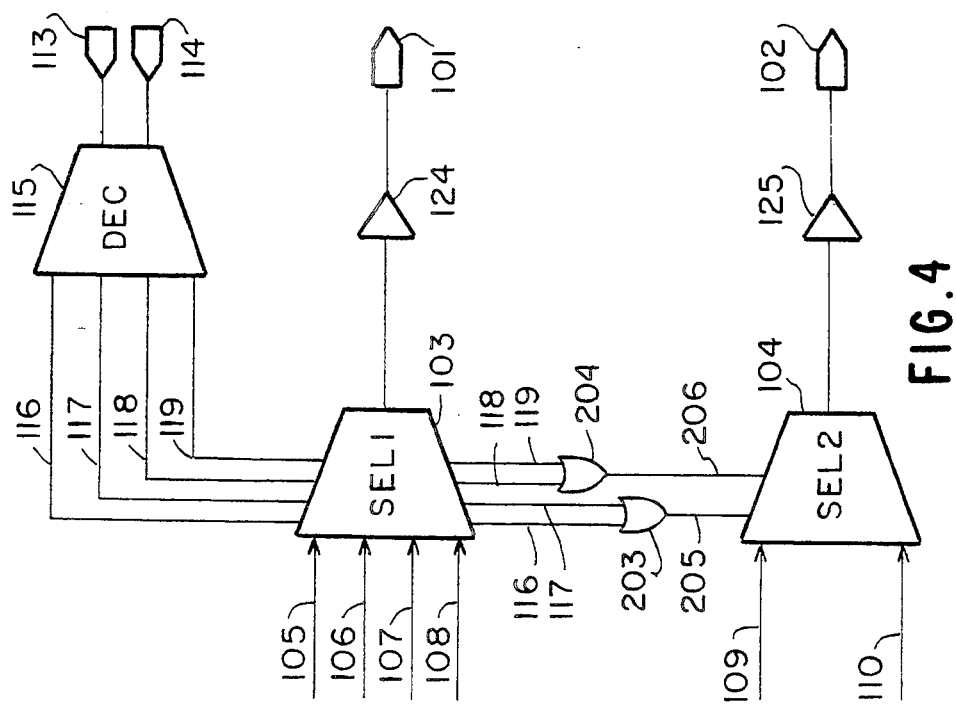
FIG. 4 is a circuit diagram of the third embodiment of the present invention.

The third embodiment diagramed in FIG. 4 is distinguished in the respect that between selectors 103, 104 no direct connections are made but two OR gate circuits 205, 206 are provided, that is, OR gate 203 supplies the OR output 205 of decoder outputs 116, 117, and OR gate 204 supplies the OR output 206 of decoder outputs 118,119, to control signal inputs, respectively, of selector 104.

This construction allows selector 104 to select internal signal 109 when decoder output 116 or 117 is 1, and internal signal 110 when decoder output 118 or 119 is 1.

In this embodiment, it is possible to selectively output at the same time as combined test signals internal signals 105 or 106 and 109, and internal signals 107 or 108 and 110, respectively.

Figure 5:
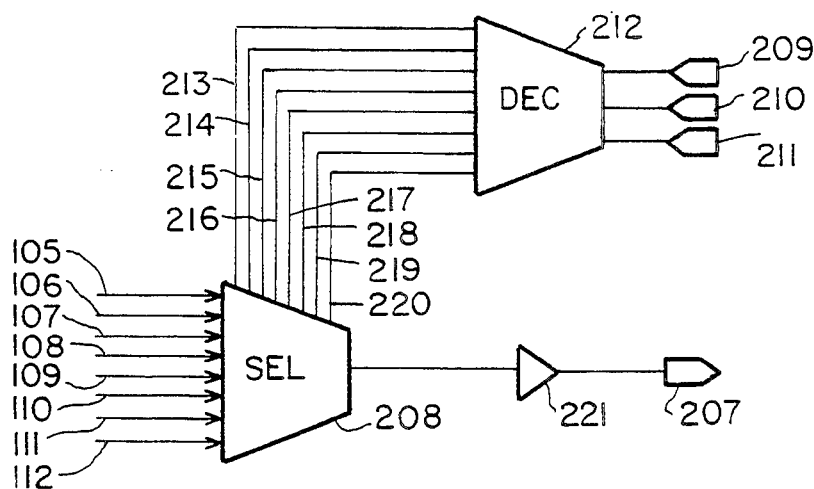
FIG. 5 is a circuit diagram of the fourth embodiment of the present invention.

In the fourth embodiment diagramed in FIG. 5, each test-mode signal is constructed as a parallel 3-bit signal. Accordingly a 3-input 8-output decoder 212 and a 8-input 1-output selector 208 are used instead of the decoder 115 and selectors 103, 104.

Selector 208 responds to one of 8 outputs 213 to 220 of decoder 212 when it goes to 1, to allow selectively the corresponding one from 8 internal signals 105 to 112 to pass through output gate 221 to test signal output terminal 207 and output from there. This embodiment is adapted for obtaining an internal signal having a low bit rate adequate to permit time-sharing process tests.

Figure 6:
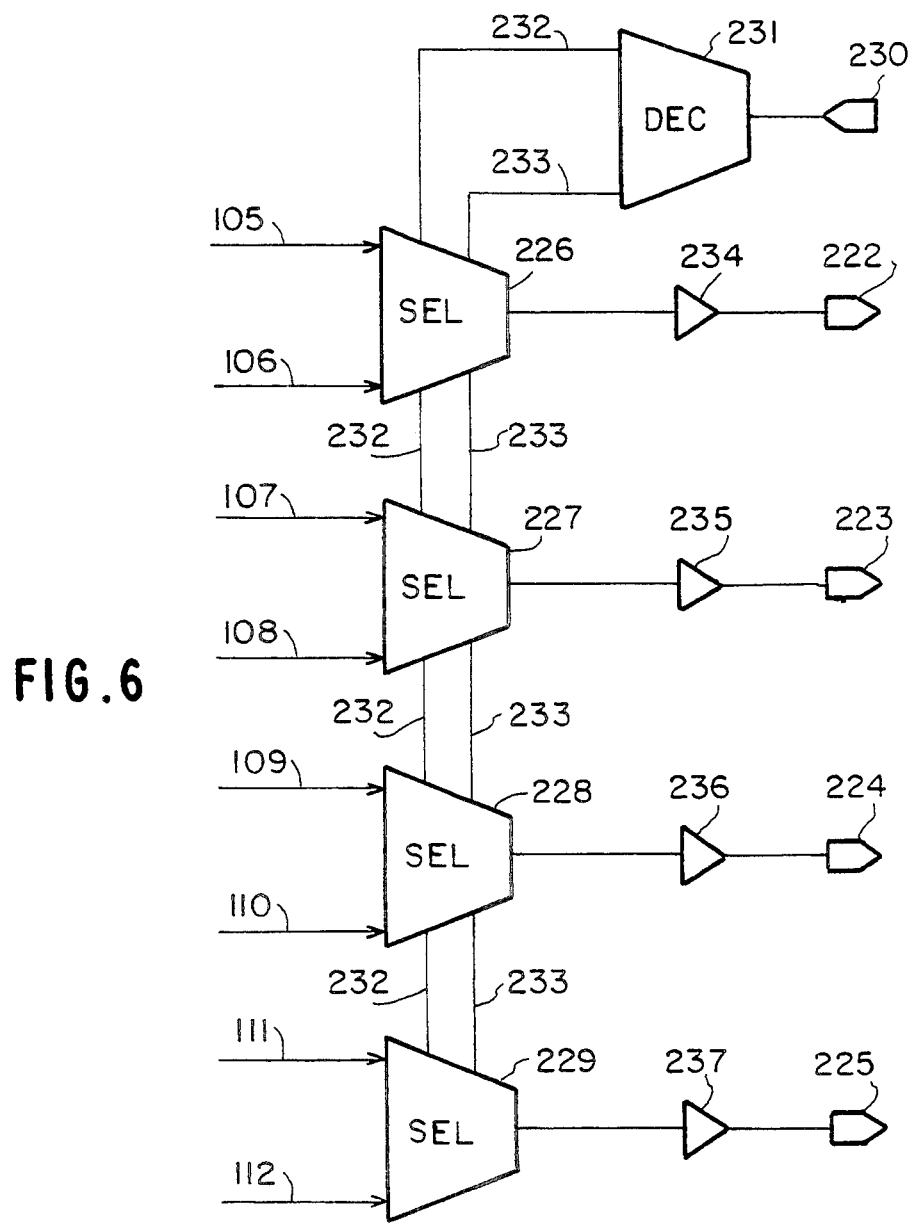
FIG. 6 is a circuit diagram of the fifth embodiment of the present invention.

In the fifth embodiment diagramed in FIG. 6, two outputs 232 and 233 of one-input decoder 231 receiving a test-mode signal from a test-mode signal input terminal 230 are supplied to the respective control signal inputs of 4 selectors 226 to 229.

Each of selectors 226 to 229 passes, in response to decoder outputs 232, 233, selectively one of the respective internal signal input pairs 105, 106; 107, 108; 109, 110; and 111, 112 through an output gate 234, 235, 236 or 237 to the respect test signal output terminals 222 to 225. This construction is adapted for the case where a relatively large number of internal signals is required to be parallel outputted for tests.

Figure 7:
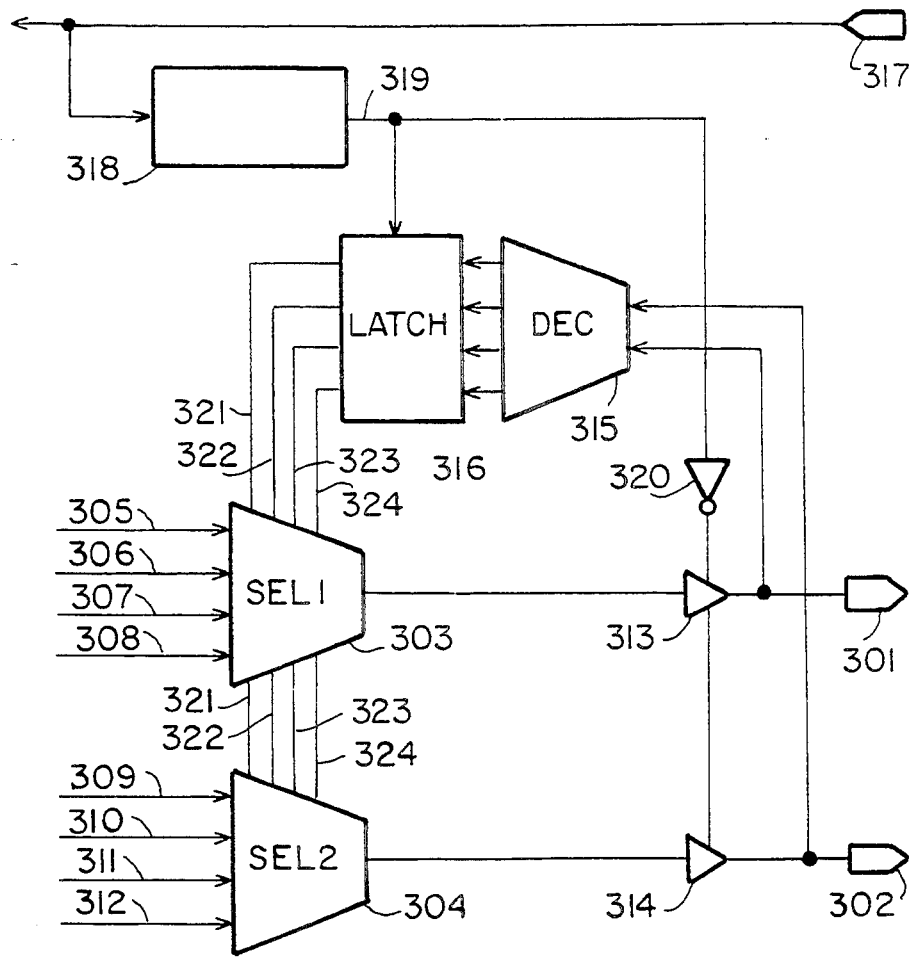
FIG. 7 is a circuit diagram of the sixth embodiment of the present invention.

Referring to FIG. 7 the sixth embodiment according to the present invention, as diagramed in it, consists of two test signal input/output terminals 301, 302 each serving both as test signal output terminal and as mode signal input terminal, a reset signal input terminal 317, a fall detecting circuit 318 capable of responding to the rear edge of a reset signal, a decoder 315 receiving a test mode signal from the above-mentioned input/output terminals, two selectors 303, 304 receiving the outputs of this decoder through a latch 316, and two 3-state buffers 313, 314 receiving the output of a fall detecting circuit 318 through an inverter 320, and gating the outputs of selectors 303,304 to input output terminals 301, 302, respectively.

As diagramed, too, this embodiment has the construction further comprising a fall detecting circuit 318, a latch 316, and inverter 320 and 3-state buffers 313, 314 compared with the first embodiment. As reset terminal 317, one originally provided in the LSI is used as it is.

Fall detecting circuit 318 supplies, in response to the fall of the reset signal, which serves to reset the whole LSI, from reset terminal 317, a latch signal 319 (holding "1" for 1 clock period only) to latch 316 and inverter 320. Inverter 320 inverts latch signal 319 to a 0 which is outputted to 3-state buffers 313, 314. Consequently these turn OFF, and switches input/output terminals 301, 302 to signal input mode.

On the other hand, decoder 315 decodes the test mode signals from input/output terminals 301, 302, and latch 316 receives, and latches in response to the above-latch signal 319, the decoded signals. Outputs 321 to 324 of latch 316 are each applied as control signals to the respective inputs of selectors 303, 304.

Selectors 303, 304 allow in response to those latch outputs 321 to 324 one of internal signals 305 to 308 and 309 to 312, respectively, to pass to 3-state buffers 313 and 314, respectively. When the output of inverter 320 becomes a 1, or when no latch output 319 is used, buffers 313, 314 becomes a low impedance state, and gates the respective outputs of selectors 303,304 to input/output terminals 301, 302.

Figure 8:
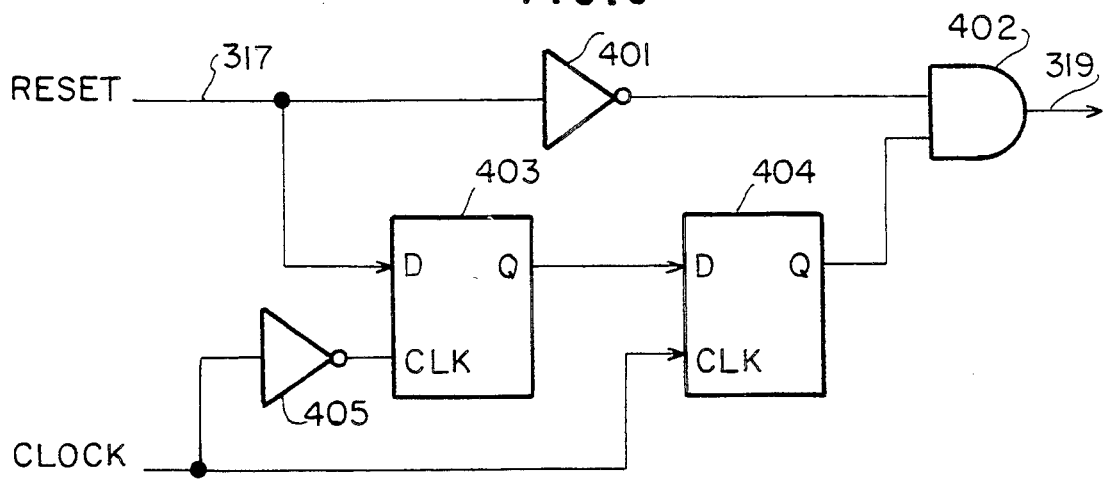
FIG. 8 is a detailed circuit diagram of a part of the sixth embodiment.

Fall detecting circuit 318 as diagramed in detail in FIG. 8 is composed of two inverters 401, 405, a AND gate 402, and two D flip-flops 403, 404.

A reset signal from reset terminal 317 is supplied not only to fall detecting circuit 318 but also to one input of AND gate 402 through inverter 401 and input D of D flip-flop 403.

Figure 9:
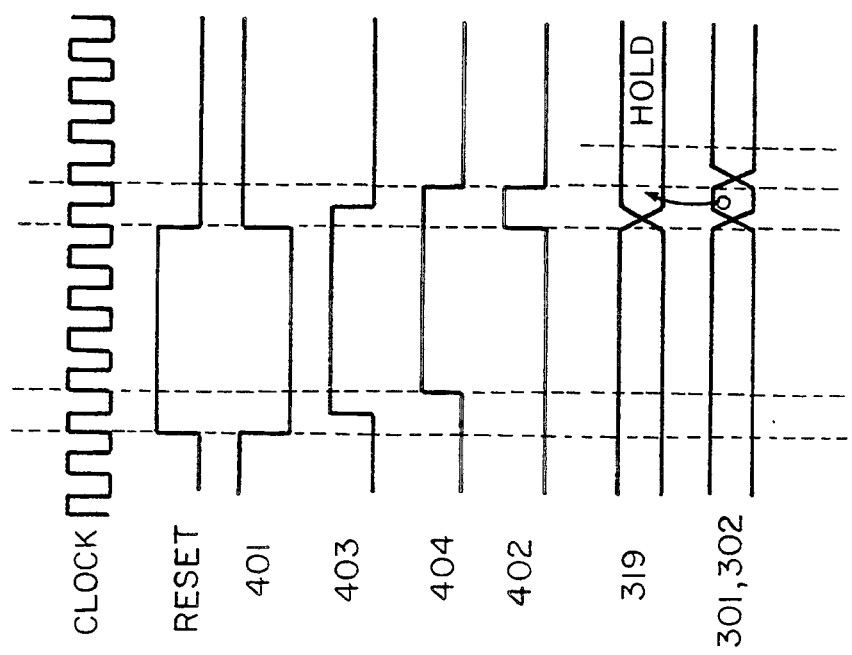
FIG. 9 is signal waveforms for illustration of the operation of the sixth embodiment.

Referring to FIG. 9 showing signal waveforms for fall detecting circuit 318, D flip-flop 403 supplies the output to D flip-flop 404 with a delay of a half the clock period by inverter 405.

D flip-flop 404 receives directly the clock signal at clock input terminal CLK, and thus supplies the output with further delay of a half clock period, consequently with one clock period delay from the front edge of the reset signal to the other input of AND gate 402. Accordingly the output of AND gate 402, or latch signal 319 is maintained at a 1 during one clock period directly following the fall of the reset signal, as shown in FIG. 9.

During this period, if supplied at input/output terminals 301, 302 from the external, test mode signals are allowed to input in decoder 315 because 3-state buffers 313, 314 continue to be in high impedance state with delay by inverter 320. On the other hand the output of decoder 315 is held by latch 316 in response to latch signal 319.

During the next clock period, latch signal 319 is maintained at a 0 but latch 316 holds its content until the latch signal goes to 1. Accordingly latch outputs 321 to 324 are remained as the decoded outputs of the previously-input test mode signals. In response to these latch outputs 321 to 324, each selector 303 or 304 supplies selectively one of the respective internal signals 305 to 308 and 309 to 312 to 3-state buffers 313, 314, respectively.

In this situation, latch signal 319 remains at 0, and accordingly 3-state buffers 313 and 314 are held in low impedance or continuity state to gate internal signals to input/output terminals 301, 302, respectively.

As apparent in comparison with the first embodiment, this embodiment permits reduction by half of the number of external connection terminals for tests. Besides for reset terminal 317 in this embodiment (FIG. 7) can be used one originally provided in the LSI, as stated above, without needing increase of external connection terminals.

Figure 10:
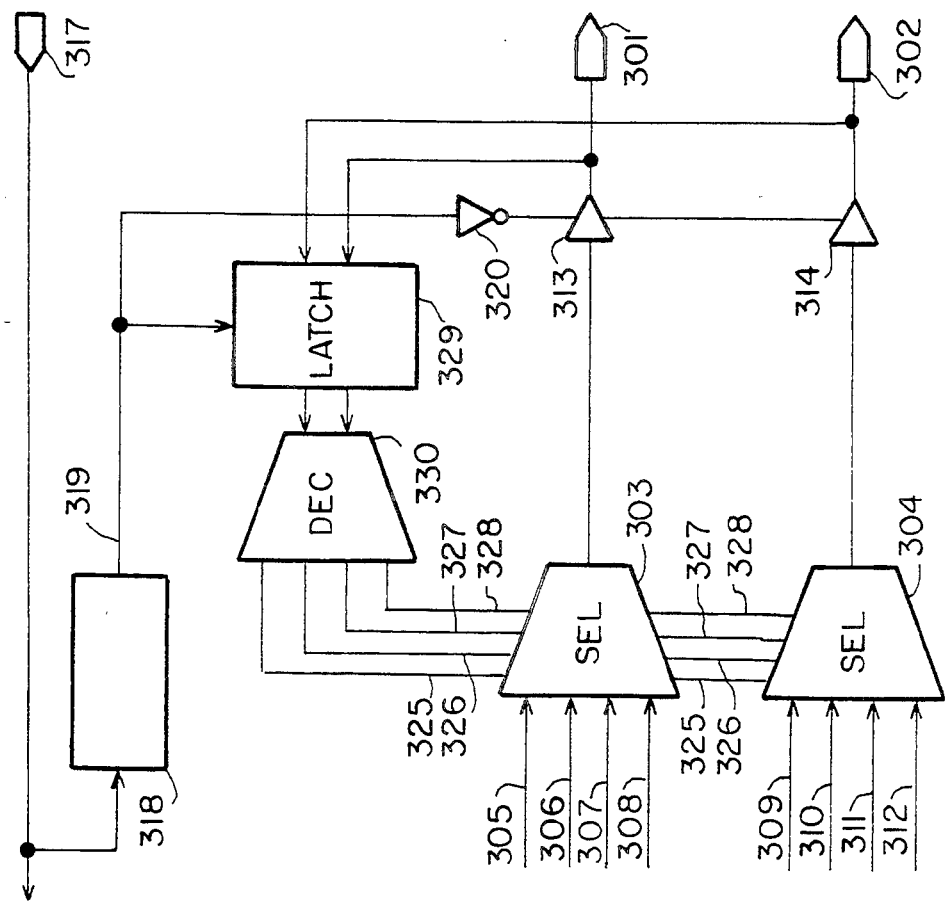
FIG. 10 is a circuit diagram of the seventh embodiment of the present invention.

Latch 316 as connected in the preceding stage to decoder 315 in the sixth embodiment described above (FIG. 7) may instead be connected in the succeeding stage as in the seventh embodiment diagramed in FIG. 10. In this case latch 329 latches parallel 2-bit test-mode signals from input output terminals 301, 302, and therefore the requirement is met with a half the number of steps for latch 316 (FIG. 7). Decoder 330 decodes the outputs of latch 329, the decoder outputs 325 to 328 being supplied to selectors 303, 304.

Figure 11:
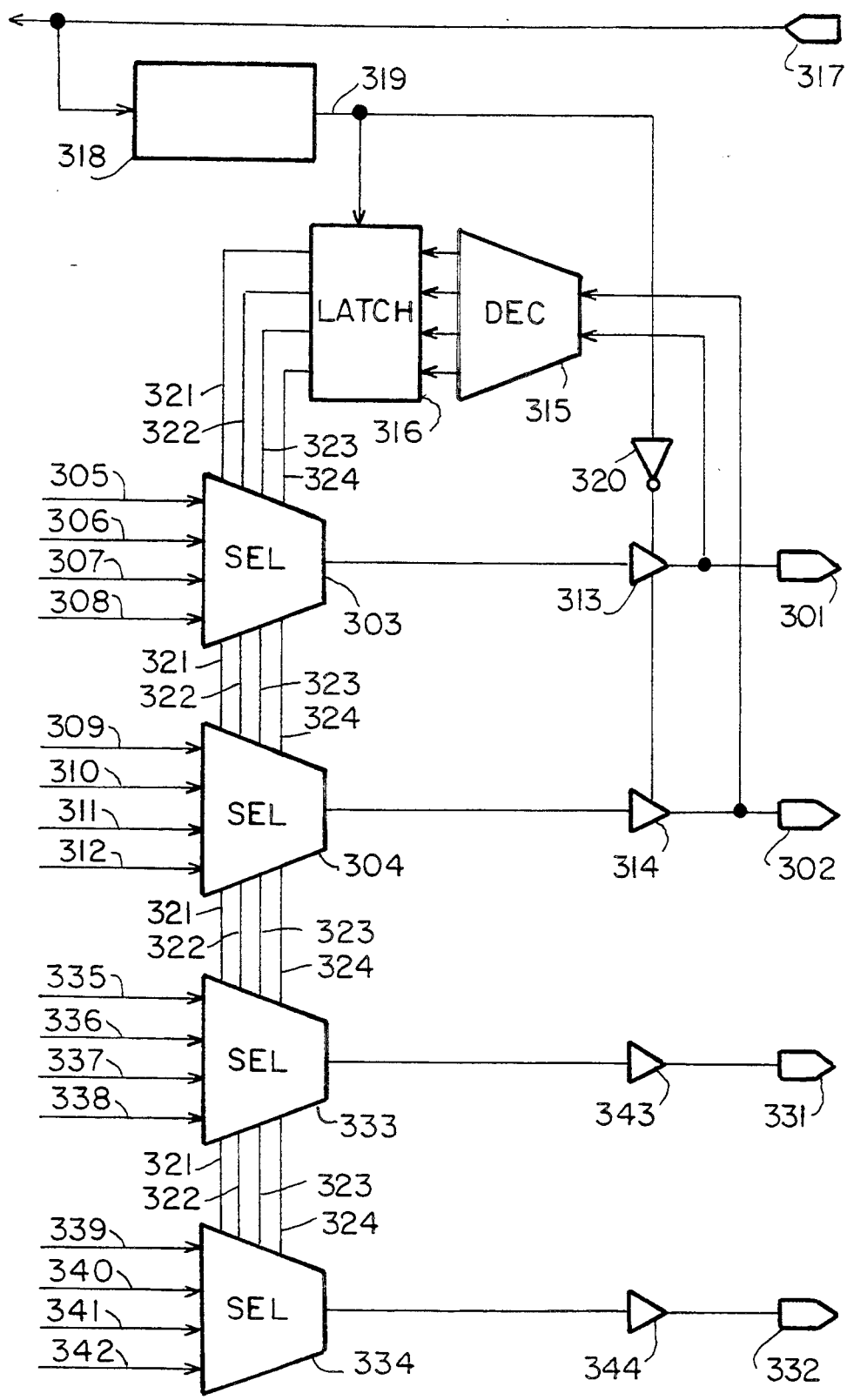
FIG. 11 is a circuit diagram of the eighth embodiment of the present invention.

In these sixth and seventh embodiments, each test signal output terminal serves as test-mode signal input terminal as well. When the number of test-mode signal inputs is required smaller than the number of test signal output terminals, the requirement is not more than to commonly use only the number of terminals required for test-mode signal inputs as in the eighth embodiment diagramed in FIG. 11 in which test signal output terminals 331, 332 have entirely the same function as test signal output terminals 101, 102, 207 and 224 to 227 in the first through fifth embodiments.

Figure 12:
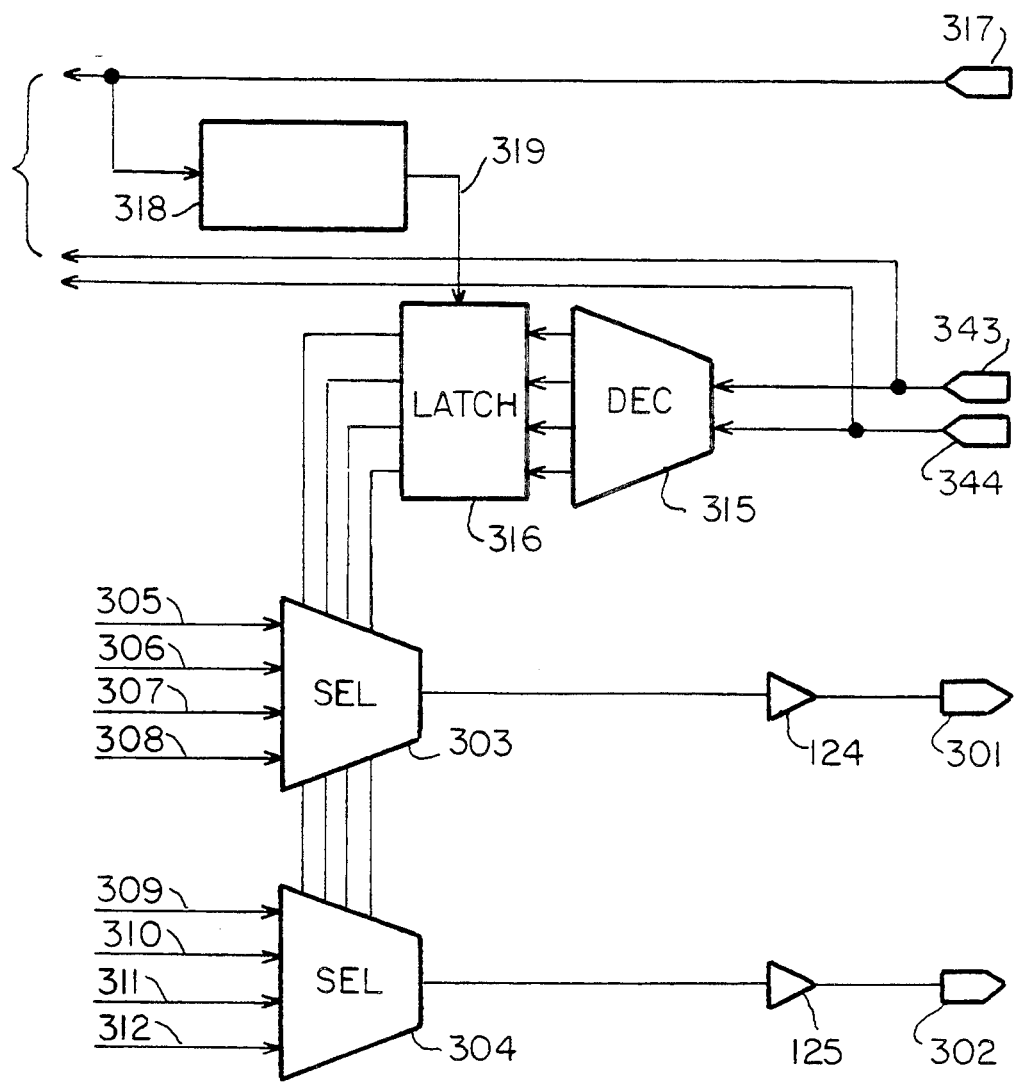
FIG. 12 is a circuit diagram of the ninth embodiment of the present invention.

In the above-described sixth through eighth embodiments, test mode signals are allowed to input into the decoder over at least one clock period direct after the rear edge of the reset signal by the utilization of the state of the LSI not in operation during this period. Referring to FIG. 12 in which the ninth embodiment based on this concept is diagramed, two common terminals 343, 344 are used as test mode signal input terminals. Herein the term "common terminal" means an external connection terminal for inputting and outputting normal signals between LSI and an external circuit. In this embodiment, two of such common terminals are used as test mode signal input terminals.

In the present embodiment, it is not carried out to use test signal output terminals as test mode signal input terminal as well as in the above-described sixth embodiment and thus two 3-state buffers 313, 314 and inverter 320 in the sixth embodiment becomes unneeded. The requirement therefore is well met with output gates 124, 125 in the first embodiment, and nothing else.

Test mode signals from common terminals 343, 344 however are required to be latched until each selector 303, 304 has selected one of internal signals 305 to 308, and 309 to 312, respectively, and therefore latch 316 together with fall detecting circuit 318 are needed because at this time common terminals 343, 344 already have been in use for delivery and receipt of common signals, and cannot be applied at the same time to the input of test mode signals.

In this embodiment fall detecting circuit 318 and latch 316 are the same as those in the sixth and eighth embodiments, and waveforms of signals at these components are essentially the same as those shown in FIG. 9, and therefore the detailed description of them is omitted.

It is possible to construct test signal output circuits of similar compound type by combining the constructional features of the sixth though ninth embodiments and the second through fifth embodiments.

As described above, the present invention permits to minimize the number of output terminals for extracting test signals with respect to LSI in operation. For example, for monitoring at the same time two groups of 8 internal signals, additional 8 in the number of external connection terminals are needed in the prior art. On the other hand, the requirement can be well fulfilled with additional four in the first embodiment, and additional two in the sixth or ninth embodiment.

In view of many restriction on the number of external connection terminals of LSI the present invention permits to extract many test internal signals without impinging on the restrictions, and has outstanding advantage in this respect.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A test signal output circuit for LSI, comprising a least one test signal output terminal, at least one test-mode signal input terminal, a decoder for decoding a signal from said test-mode signal input terminal, and at least one selector for passing, in response to the output of said decoder, at least one of a plurality of internal signals in said LSI to said test signal output terminals, wherein the number of said test signal output terminals is n, the number of said test-mode signal input terminals is m, said decoder is of m-input and $2^m$-output, and the number of said selectors, each being of $2^m$-input, is n, $2^m \times n$ ones of said internal signals being produced at said test signal output terminals.

2. A test signal output circuit for LSI comprising at least one test signal output terminal, at least one test-mode signal input terminal, a decoder for decoding a signal from said test-mode signal input terminal, and at least one selector for passing, in response to the output of said decoder, at least one of a plurality of internal signals in said LSI to said test signal output terminals, wherein at least one of said test-mode signal input terminals is constructed to be in common to said test signal output terminal, a fall detecting circuit for detecting the rear edge of a reset input signal serving to reset the whole LSI, an input-output switching circuit for switching, in response to the output of said fall detecting circuit, said test signal output terminal between a test-mode signal input mode and a test signal output mode, and a latch for latching, in response to the output of said fall detecting circuit, one of the outputs of said decoder and a signal from said test signal output terminal that is being in said test-mode signal input mode, the output of said selector switched controlled in response to the output of said latch.

3. A test signal output circuit for LSI comprising at least one test signal output terminal, at least one test-mode signal input terminal, a decoder for decoding a signal from said test-mode signal input terminal, and at least one selector for passing, in response to the output of said decoder, at least one of a plurality of internal signals in said LSI to said test signal output terminals, further comprising an ordinary terminal, at least one of said test-mode signal input terminals being constructed to be in common to an ordinary terminal, a fall detecting circuit for detecting the rear edge of a reset input signal serving to reset the whole LSI, and a latch for latching in response to the output of said fall detecting circuit, one of the outputs of said decoder and a signal from said ordinary terminal the output of said selector being controlled in response to the output of said latch.

* * * * *